US010374105B2

(12) United States Patent
Li et al.

(10) Patent No.: US 10,374,105 B2
(45) Date of Patent: Aug. 6, 2019

(54) OPTOELECTRONIC DEVICE INCLUDING A BURIED METAL GRATING FOR EXTRAORDINARY OPTICAL TRANSMISSION (EOT)

(71) Applicant: The Board of Trustees of the University of Illinois, Urbana, IL (US)

(72) Inventors: Xiuling Li, Champaign, IL (US); Daniel M. Wasserman, West Lake Hills, TX (US); Xiang Zhao, San Jose, CA (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 293 days.

(21) Appl. No.: 15/200,345

(22) Filed: Jul. 1, 2016

(65) Prior Publication Data

US 2017/0005207 A1    Jan. 5, 2017

Related U.S. Application Data (60) Provisional application No. 62/187,353, filed on Jul. 1, 2015.

(51) Int. Cl.
*H01L 31/02* (2006.01)
*H01L 33/06* (2010.01)
(Continued)

(52) U.S. Cl.
CPC .. *H01L 31/02327* (2013.01); *H01L 31/02005* (2013.01); *H01L 31/02008* (2013.01);
(Continued)

(58) Field of Classification Search
None
See application file for complete search history.

(56) References Cited

U.S. PATENT DOCUMENTS 8,009,356 B1 * 8/2011 Shaner ............... G02B 27/56
359/288
8,278,191 B2  10/2012 Hildreth et al.
(Continued)

FOREIGN PATENT DOCUMENTS

WO    WO 02/023607 A1    3/2002
WO    WO 02/103752 A2   12/2002

OTHER PUBLICATIONS

Surface Plasmon-Enhanced Nanopillar PhotodetectorsPradeep Senanayake, Chung-Hong Hung, Joshua Shapiro, Andrew Lin, Baolai Liang, Benjamin S. Williams, and D. L. HuffakerNano Letters 2011 11 (12), 5279-5283 (Year: 2011).*

(Continued)

*Primary Examiner* — Whitney Moore
(74) *Attorney, Agent, or Firm* — Brinks Gilson & Lione (57) ABSTRACT An optoelectronic device includes an etched body comprising a buried metal contact layer on a top surface of a semiconductor structure, which comprises one or more semiconductor layers. The buried metal contact layer includes an arrangement of holes therein. A plurality of nanopillar structures protrude from the top surface of the semiconductor structure and pass through the arrangement of holes. Each nanopillar structure is surrounded at a base thereof by a portion of the buried metal contact layer. When the etched body is exposed to incident radiation having a wavelength in the range from about 300 nm to about 10 microns, at least about 50% of the incident radiation is transmitted through the etched body at a peak transmission wavelength $\lambda_{max}$.

20 Claims, 10 Drawing Sheets (51) Int. Cl.
  *H01L 33/58* (2010.01)
  *H01L 33/62* (2010.01)
  *G02F 1/1335* (2006.01)
  *H01L 31/0232* (2014.01)
  *H01L 31/0352* (2006.01)
  *H01L 31/0725* (2012.01)
  *H01L 31/0735* (2012.01)

(52) U.S. Cl.
  CPC .. *H01L 31/035218* (2013.01); *H01L 31/0725* (2013.01); *H01L 31/0735* (2013.01); *H01L 33/06* (2013.01); *H01L 33/58* (2013.01); *H01L 33/62* (2013.01); *G02F 1/133509* (2013.01); *G02F 2202/36* (2013.01); *G02F 2203/055* (2013.01); *H01L 2933/0058* (2013.01); *H01L 2933/0066* (2013.01); *Y02E 10/544* (2013.01)

(56) References Cited

U.S. PATENT DOCUMENTS

| | | | |
|---|---|---|---|
| 8,951,430 B2 | 2/2015 | Li et al. | |
| 8,980,656 B2 | 3/2015 | Li et al. | |
| 2011/0263119 A1 | 10/2011 | Li et al. | |
| 2013/0052762 A1* | 2/2013 | Li | B82Y 10/00 438/22 |
| 2014/0175546 A1* | 6/2014 | Huffaker | H01L 31/022425 257/342 |
| 2015/0137321 A1 | 5/2015 | Li et al. | |

OTHER PUBLICATIONS

Anglin, K. et al., "Voltage-controlled active mid-infrared plasmonic devices", *J. Appl. Phys.*, 109, 123103 (2011) pp. 1-5.
Balasundaram, Karthik et al., "Photonic crystal membrane reflectors by magnetic field-guided metal-assisted chemical etching", *Appl. Phys. Lett.*, 103, 214103 (2013) pp. 1-4.
Bravo-Abad, J. et al., "How light emerges from an illuminated array of subwavelength holes", *Nature Physics*, 2 (2006), pp. 120-123.
Clapham, P. B. et al., "Reduction of Lens Reflexion by the 'Moth Eye' Principle", *Nature*, 244 (1973) pp. 281-282.
Collin, Stephane et al., "Nearly Perfect Fano Transmission Resonances through Nanoslits Drilled in a Metallic Membrane", *Physical Review Letters*, 104, 027401 (2010) pp. 1-4.
DeJarld, Matt et al., "Formation of High Aspect Ratio GaAs Nanostructures with Metal-Assisted Chemical Etching", *Nano Lett.*, 11 (2011) pp. 5259-5263.
Ebessen, T. W. et al., "Extraordinary optical transmission through sub-wavelength hole arrays", *Nature*, 391 (1998) pp. 667-669.
Genet, C. et al., "Fano-type interpretation of red shifts and red tails in hole array transmission spectra", *Optics Communications*, 225 (2003) pp. 331-336.
Genet, C. et al., "Light in tiny holes", *Nature*, 445 (2007) pp. 39-46.
Ghaemi, H. F. et al., "Surface Plasmons enhance optical transmission through subwavelength holes", *Physical Review B*, 58, 11 (1998) pp. 6779-6782.
Huang, Yi-Fan et al., "Improved broadband and quasi-omnidirectional anti-reflection properties with biomimetic silicon nanostructures", *Nature Nanotechnology*, 2 (2007) pp. 770-774.
Huang, Zhipeng et al., "Metal-Assisted Chemical Etching of Silicon: A Review", *Adv. Mater.*, 23 (2011) pp. 285-308.
Khurgin, Jacob B. et al., "Reflecting upon the losses in plasmonics and metamaterials", *MRS Bulletin*, 37 (2012) pp. 768-779.
Kim, Seung Hyun et al., "Inverse Metal-Assisted Chemical Etching Produces Smooth High Aspect Ratio InP Nanostructures", *Nano Lett.*, 15 (2015) pp. 641-648.
Lee, K. G. et al., "Coupling of Surface Plasmon Polaritons and Light in Metallic Nanoslits", *Physical Review Letters*, 95, 103902 (2005) pp. 1-4.
Lee, S. C. et al., "Quantum dot infrared photodetector enhanced by surface plasma wave excitation", *Optics Express*, 17, 25 (2009) pp. 23160-23168.
Li, X et al., "Metal-assisted chemical etching in $Hf/H_2O_2$ produces porous silicon", *Appl. Phys. Lett.*, 77, 16 (2000) pp. 2572-2574.
Li, Xiuling, "Metal assisted chemical etching for high aspect ratio nanostructures: A review of characteristics and applications in photovoltaics", *Current Opinion in Solid State and Materials Science*, 16 (2012) pp. 71-81.
Liu, Haitao et al., "Microscopic theory of the extraordinary optical transmission", *Nature*, 452 (2008) pp. 728-731.
Liu, Runyu et al., "Optimizing light absorption in quantum dot infrared photodetectors by tuning surface confinement of surface plasmonic waves", *J. Phys. D: Appl. Phys.*, 46, 015102 (2013) pp. 1-5.
Moharam, M. G. et al., "Rigorous coupled-wave analysis of planar-grating diffraction", *J. Opt. Soc. Am.*, 71, 7 (1981) pp. 811-818.
Moharam, M. G. et al., "Formulation for stable and efficient implementation of the rigorous coupled-wave analysis of binary gratings", *J. Opt. Soc. Am. A*, 12, 5 (1995) pp. 1068-1076.
Mohseni, Parsian K. et al., "GaAs pillar array-based light emitting diodes fabricated by metal-assisted chemical etching", *J. Appl. Phys.*, 114, 064909 (2013) pp. 1-6.
van der Molen, K. L. et al., "Influence of hole size on the extraordinary transmission through subwavelength hole arrays", *Appl. Phys. Lett.*, 85, 19 (2004) pp. 4316-4318.
Pacifici, D. et al., "Quantitative determination of optical transmission through subwavelength slit arrays in Ag films: Role of surface wave interference and local coupling between adjacent slits", *Physical Review B*, 77, 115411 (2008) pp. 1-5.
Pacifici, Domenico et al., "All-optical modulation by plasmonic excitation of CdSe quantum dots", *Nature Photonics*, 1 (2007) pp. 402-406.
Ribaudo, T. et al., "Active Control and Spatial Mapping of Mid-Infrared Propagating Surface Plasmons", *Optics Express*, 17, 9 (2009) pp. 7019-7024.
Rivas, J. Gomez et al., "Thermal switching of the enhanced transmission of terahertz radiation through subwavelength apertures", *Optics Letters*, 29, 14 (2004) pp. 1680-1682.
Sarrazin, Michael et al., "Role of Wood anomalies in optical properties of thin metallic films with a bidimensional array of subwavelength holes", *Physical Review B*, 67, 085415 (2003) pp. 1-8.
Schuster, Thomas et al., "Normal vector method for convergence improvement using the RCWA for crossed gratings", *J. Opt. Soc. Am. A*, 24, 9 (2007) pp. 2880-2890.
Wilson, S. J. et al., "The Optical Properties of 'Moth Eye' Antireflection Surfaces", *Optica Acta*, 29, 7 (1982) pp. 993-1009.
Wu, Wei et al., "Plasmonic enhanced quantum well infrared photodetector with high detectivity", *Appl. Phys. Lett.*, 96, 161107 (2010) pp. 1-3.
Yablonovitch, Eli et al., "Intensity Enhancement in Textured Optical Sheets for Solar Cells", *IEEE Transactions on Electron Devices*, ED-29, 2 (1982) pp. 300-305.
Yasukawa, Yukiko et al., "Site-selective chemical etching of GaAs through a combination of self-organized spheres and silver particles as etching catalyst", *Electrochemistry Communications*, 10 (2008) pp. 757-760.
Yasukawa, Yukiko et al., "Morphological Control of Periodic GaAs Hole Arrays by Simple Au-Mediated Wet Etching", *Journal of the Electrochemical Society*, 159, 5 (2012) pp. D328-D332.
Yasukawa, Yukiko et al., "Periodic GaAs Convex and Hole Arrays Produced by Metal-Assisted Chemical Etching", *Jpn. J. Appl. Phys.*, 49,116502 (2010) pp. 1-4.
Zeng, L. et al., "Efficiency enhancement in Si solar cells by textured photonic crystal back reflector", *Appl. Phys. Lett.*, 89, 111111 (2006) pp. 1-3.

* cited by examiner

OPTOELECTRONIC DEVICE INCLUDING A BURIED METAL GRATING FOR EXTRAORDINARY OPTICAL TRANSMISSION (EOT)

RELATED APPLICATION

The present patent document claims the benefit of the filing date under 35 U.S.C. § 119(e) to U.S. Provisional Patent Application Ser. No. 62/187,353, which was filed on Jul. 1, 2015, and is hereby incorporated by reference in its entirety.

FEDERALLY SPONSORED RESEARCH

This invention was made with government support under DMR-1210398 awarded by National Science Foundation. The Government has certain rights in the invention.

TECHNICAL FIELD

The present disclosure is related generally to optoelectronic devices and more particularly to optoelectronic devices that include structures for extraordinary optical transmission (EOT).

BACKGROUND

A large number of photonic structures and devices either benefit from, or require, active modulation of their optical response. A metal film providing a near-uniform lateral voltage (current) distribution represents an ideal electrical contact for such electro-optical devices. Unfortunately, the same free electrons that are responsible for the high DC conductivity of metals also dominate their optical properties, causing metals to be highly reflective at optical frequencies. In addition to their traditional role as electrical contacts for electro-optic devices, metals are of increasing interest for their optical properties. The wide and varied field of plasmonics, for instance, is in large part geared towards leveraging the ability of metal/dielectric structures to confine light to subwavelength volumes, thus enhancing light-matter interaction, and enabling next-generation nanophotonic devices. Yet, here too, the use of metals comes with a cost, as parasitic absorption of light via (ohmic) losses in plasmonic materials, in addition to strong reflection, limit the functionality of many plasmonic structures. Thus, the integration of metal into any optical or optoelectronic structure or device, while often providing very real benefits (subwavelength confinement, uniform electrical contact, etc.) is almost always accompanied by absorption and reflection losses compromising the ultimate performance of the optical structure or device.

Transmission of light through a smooth interface between two materials can be related to the change of material permittivity via the Fresnel equations. However, this simple relationship is violated in structured composites. All-dielectric "moth-eye" interfaces are known to reduce the reflectivity between two dielectric media by creating a surface layer with gradually changing refractive index. Nanostructuring, or even simple roughening, of semiconducting solar cell material can efficiently scatter incident radiation, increasing path length for light in the detector structure and acting as an anti-reflection coating. However, for the development of active devices, structuring the dielectric interface does little to enable efficient electrical contact, which requires the integration of (often, highly reflective) conducting material with the devices' active dielectric components.

The optical response of reflecting structured metallic films can be modified by coupling the incident radiation to a special type of highly-confined electromagnetic waves supported by thin metal films, surface plasmon polaritons (SPPs), followed by the out-coupling of SPPs into the dielectric on the other side of the film. Remarkably, the percentage of light transmitted through such structured metal films can exceed, at select frequencies, the percentage of open area in the films, a phenomenon known as extraordinary optical transmission (EOT), a source of substantial interest in the optics community since the initial demonstration of EOT nearly two decades ago. More recent research, aimed at elucidation of the origin of EOT, has provided a number of complex coupled (and sometimes competing) mechanisms, related to the excitation, transmission, and out-coupling of i) SPPs at the two metal-dielectric interfaces and ii) waveguide modes supported by the openings in the perforated metal films.

BRIEF SUMMARY

An optoelectronic device including a buried extraordinary optical transmission (EOT) structure is described herein along with a method of making such a device.

The optoelectronic device includes an etched body comprising a buried metal contact layer on a top surface of a semiconductor structure, which comprises one or more semiconductor layers. The buried metal contact layer includes an arrangement of holes therein. A plurality of nanopillar structures protrude from the top surface of the semiconductor structure and pass through the arrangement of holes. Each nanopillar structure is surrounded at a base thereof by a portion of the buried metal contact layer. When the etched body is exposed to incident radiation having a wavelength in the range from about 300 nm to about 10 microns, at least about 50% of the incident radiation is transmitted through the etched body at a peak transmission wavelength $\lambda_{max}$.

A method of producing an optoelectronic device including a buried EOT structure includes forming a patterned metal contact layer on a top surface of a semiconductor structure comprising one or more semiconductor layers, where the patterned metal contact layer includes an arrangement of holes therein. The semiconductor structure is immersed in an etchant, and the top contact layer sinks into the semiconductor structure as portions thereof directly under the top contact layer are etched. During etching, unetched portions of the semiconductor structure are extruded through the holes of the patterned metal contact layer to form an array of nanopillar structures protruding from the top surface of the semiconductor structure, where each nanopillar structure passes through one of the holes. An optoelectronic device including a buried EOT structure is thus formed.

BRIEF DESCRIPTION OF THE DRAWINGS

FIGS. 7A-7D show a comparison of TE and TM transmission as a function of incident angle for angles from θ=0° to θ=30°, where FIGS. 7A and 7C show experimental results and FIGS. 7B and 7D show simulated results, including substrate effects. The etched bodies used as samples included buried EOT structures having the following characteristics: Λ=0.77 μm, D=0.55 μm and h=0.5 μm.

FIGS. 8A-8D show a comparison of TE and TM transmission as a function of incident angle for angles from θ=0° to θ=30°, where FIGS. 8A and 8C show experimental results and FIGS. 8B and 8D show simulated results, including substrate effects. The etched bodies used as samples included buried EOT structures having the following characteristics: Λ=1.75 μm, D=1.2 μm and h=0.7 μm.

DETAILED DESCRIPTION

A patterned metal film capable of providing a near-uniform lateral voltage/current distribution over the structured top surface of a semiconductor device, yet also capable of controlling, and potentially enhancing, the coupling of incident radiation into the device, may find application in a broad range of light-emitting and -detecting optoelectronic devices. This disclosure reveals the surprising result that light transmission through a structured semiconducting surface partially covered by a patterned metal film can exceed the light transmission through a completely uncovered, smooth semiconducting surface. The structured semiconducting surface and the patterned metal film that exhibit this extraordinary optical transmission (EOT) may be formed by metal-assisted chemical etching. A number of optoelectronic devices, including photodetectors and light emitting diodes (LEDs), may be enabled by this technology, where the patterned metal film may act as a both an electrical contact and optical coupler for the light-transmitting surface of the device.

Metal-assisted chemical etching offers a controllable and low-defect method of etching semiconductors such as Si and GaAs, and is applied here to form such optoelectronic devices. The method utilizes a metal pattern layer formed on a surface of a semiconductor as a catalyst for etching the underlying semiconductor. Etching occurs upon exposure to a suitable etchant that includes an oxidizing agent (to generate holes) and an acid (to remove the oxidized species). It has been shown that metal-assisted chemical etching can produce nanowires or nanopillars of high aspect ratios in silicon, germanium and III-V semiconductors (e.g., see U.S. Pat. No. 8,486,843, entitled "Method of Forming Nanoscale Three-Dimensional Patterns in a Porous Material," and U.S. Pat. No. 8,951,430, entitled "Metal-Assisted Chemical Etching to Produce III-V Semiconductor Nanostructures," both of which are hereby incorporated by reference in their entirety). Since it is a wet etch technique, MacEtch can be carried out economically in large quantities in comparison with popular dry etch methods, which may require a vacuum or plasma.

Figure 1A:
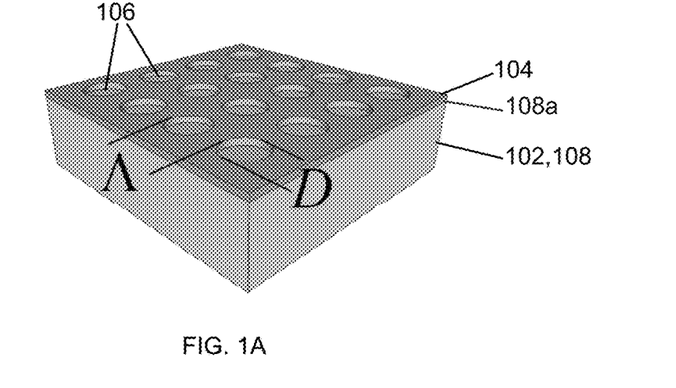
FIGS. 1A and 1B show perspective-view schematics of a metal-assisted chemical etching (MacEtch) process to form an etched body comprising nanopillar semiconductor structures and a buried metal contact layer.
Figure 1B:
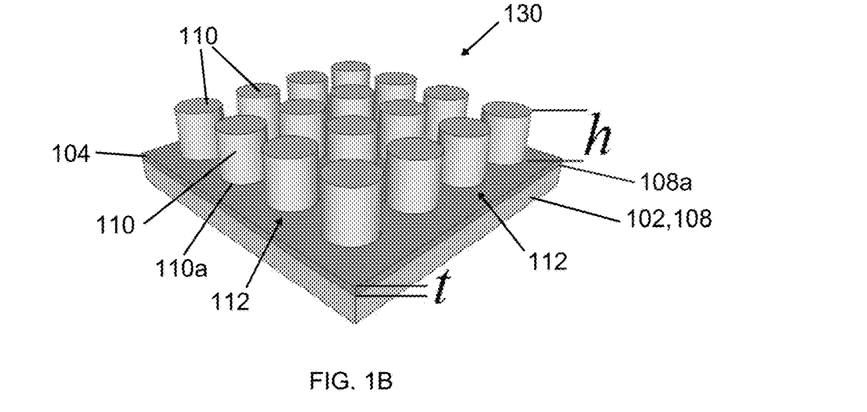

To form the optoelectronic devices described in this disclosure, a patterned metal contact layer 104 is formed on a top surface of a semiconductor structure 102 comprising one or more semiconductor layers 108, as shown for example in FIG. 1A. The patterned metal contact layer 104 includes an arrangement of holes 106 therein, such that only a portion of the top surface is covered, typically from about 30% to about 90%. The patterned metal contact layer 104 may thus be described as a metal mesh or grating. The semiconductor structure 102 is immersed in a suitable etchant, and the patterned metal contact layer 104 sinks into the semiconductor structure 102 as portions thereof directly under the patterned metal contact layer 104 are etched, as indicated in FIG. 1B. During etching, unetched portions of the semiconductor structure 102 are effectively extruded through the holes 106 of the patterned metal contact layer 104 to form an array of nanopillar structures 110.

Figure 1C:
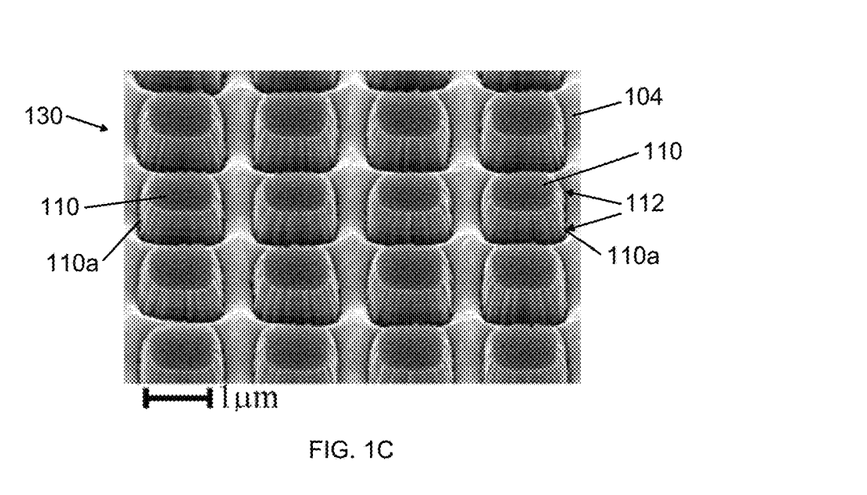
FIG. 1C shows a scanning electron microscope (SEM) image of a portion of the etched body.

An exemplary etched body 130 is illustrated in FIG. 1B and shown in the scanning electron microscope (SEM) image of FIG. 1C, where Λ=1.75 microns, D=1.2 μm and h=0.77 μm for a patterned gold contact layer 104 and GaAs nanopillar structures 110. Each nanopillar structure 110 is surrounded at a base 110a thereof by a portion 112 of the patterned metal contact layer 104, which may be described (after etching) as a buried metal contact layer or buried metal grating 104. Remarkably, when exposed to incident radiation, the exemplary etched body 130 shown in FIG. 1C can transmit about 60% or more of the incident radiation in the wavelength range of about 5 microns to about 7.5 microns, as discussed further below with respect to FIG. 3.

For any etched body 130 having a buried metal contact layer 104, a predetermined wavelength range of the incident radiation may be selectively transmitted. Transmission of the incident radiation is at a maximum at a peak transmission wavelength $\lambda_{max}$ within the predetermined wavelength range, as can be determined from the transmission curves in FIG. 3, which plots transmission as a function of wavelength for a number of exemplary etched bodies 130. The peak transmission wavelength $\lambda_{max}$ and the predetermined wavelength range may be determined by a number of factors, including the period (pitch) Λ of the arrangement of holes 106, the height h of the nanopillar structures 110, and the composition of the semiconductor layers 108. Generally speaking, when an etched body 130 including a buried metal contact layer 104 is exposed to incident radiation having a wavelength in the range from about 300 nm to about 10 microns, at least about 50% of the incident radiation is transmitted at the peak transmission wavelength $\lambda_{max}$. In some cases, at least about 60%, at least about 70%, at least about 80%, or at least about 90%—and up to 100%—of the incident radiation may be transmitted at the peak transmission wavelength $\lambda_{max}$. The predetermined wavelength range may encompass or fall within one or more of the following ranges: near-ultraviolet (near-UV) wavelengths (e.g., from about 300 nm to about 400 nm), visible wavelengths (e.g., from about 400 nm to about 700 nm), near-infrared wavelengths (e.g., from about 700 nm to about 2 microns), mid-infrared wavelengths (e.g., from about 2 microns to about 10 microns) and/or another desired wavelength range.

Thus, an optoelectronic device 100 including such a buried metal contact layer 104 may be formed, as can be seen for example in reference to FIGS. 2A-2E, which show cross-sectional schematics of exemplary optoelectronic devices 100 formed by the MacEtch process. Due to its position in the device after etching and its transparency, the buried metal contact layer 104 may also be referred to as a buried EOT structure, which can enable high light transmission into the device 100 as well as nearly uniform electrical contact. A buried metal contact layer 104 capable of providing a near-uniform lateral voltage/current distribution over the surface of the device, yet also capable of controlling, and enhancing, the coupling of incident radiation (indicated by the arrows in FIGS. 2A-2C) into the device, may be useful for a broad range of optoelectronic devices, including light-emitting devices as well as photodetectors and solar cells. As indicated above, the incident light of interest may have a wavelength ranging from the ultraviolet to far-infrared portions of the electromagnetic spectrum, and the term "optical transmission" may refer to transmission of some or all of these wavelengths.

Referring to FIGS. 2A-2E, each optoelectronic device 100 includes a buried metal contact layer 104 on a top surface 108a of the semiconductor structure 102, which includes one or more semiconductor layers 108. A plurality of nanopillar structures 110 protrude from the top surface 108a of the semiconductor structure 102 and pass through the holes 106 of the buried metal contact layer 104, with one nanopillar structure 110 passing through each hole 106. Each nanopillar structure 110 is surrounded at a base 110a thereof by a surrounding portion 112 of the buried metal contact layer 104. The one or more semiconductor layers 108 may include an active region, such as a p-n junction, p-i-n junction, double heterostructure, multiple quantum well or quantum dot structure. While the simple cross-sectional schematics of FIGS. 2A-2E show only a handful of nanopillar structures 110 protruding from the surface 108a, it is understood that an optoelectronic device 100 including a buried metal contact layer 104 as described herein may include tens, hundreds, or thousands of the nanopillar structures 110.

As shown in the figures, the optoelectronic device 100 may further include a bottom metal contact layer 114 disposed on a bottom surface of the semiconductor structure 102, with the buried metal contact layer 104 described above serving as a top metal contact layer to provide electrical connection to the optoelectronic device 100. In contrast to the optically transparent top metal contact layer 104, the bottom metal contact layer 114 may have the reflective properties of a typical metal film. Each of the top and bottom metal contact layers 104,114 may have a micro- or nanoscale thickness t of less than 500 nm. Typically, the thickness t is in the range from about 5 nm to about 200 nm, from 1 nm to about 100 nm, or from 10 nm to about 30 nm.

Due to their high reflectivity, metals are typically confined to the perimeter of light transmissive surfaces when used as electrical contacts for optoelectronic devices, although such positioning may lead to an undesirably nonuniform current distribution over the surface. As an alternative, conductive oxides such as indium-tin oxide (ITO) are often employed to form optically transparent contact layers that can uniformly distribute current over the device surface. Due to the uncharacteristic optical properties of the buried metal contact layer 104, however, a conductive oxide such as indium-tin oxide is not required to obtain a uniform current distribution while allowing light transmission into the device. Instead, the buried metal contact layer 104 of the optoelectronic device 110 may cover a substantial portion of the surface 108a while still permitting high optical transmission. Typically, at least about 30%, at least about 40%, at least about 50%, or at least about 60%—and as much as about 80% or 90%—of the surface 108a is covered by the buried metal contact layer 104, where the percentages are areal percentages. The buried metal contact layer 104 may comprise one or more metals selected from the group consisting of: Ag, Al, Au, Co, Cr, Cu, Fe, Hf, Ir, Mn, Mo, Pd, Pt, Rb, Re, Rh, Ta, Ti, V, W, Zn, and Zr. The reflective bottom metal contact layer 114, which does not require patterning and thus may cover 100% of the bottom surface of the semiconductor structure 102 in terms of area, may also comprise one or more metals from the above group.

Each of the one or more semiconductor layers, as well as the nanopillar structures, comprise a semiconductor, which may be doped, semi-insulating, intrinsic or undoped. The semiconductor(s) that make up the nanopillar structures and the one or more semiconductor layers may be selected from the group consisting of Si, Ge, GaAs, InAs, InSb, GaN, GaP, GaSb, GaAsP, GaAsN, GaInAs, GaInP, AlGaAs, AlGaIn, AlGaP, AlGaInP, InGaAs, InGaN, InGaP, InGaSb, InAsSb, AlN, AlGaN, ZnSe, diamond (C), $Ga_2O_3$ and SiC. Suitable dopants include n- and p-dopants known in the art.

Figure 2A:
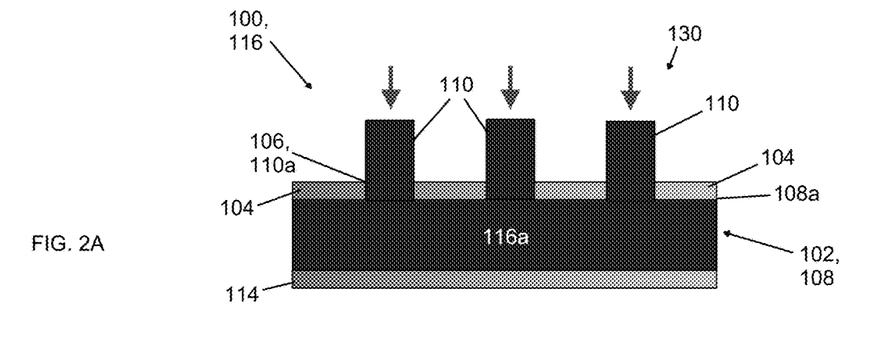
FIGS. 2A-2E show cross-sectional schematics of exemplary photodetectors, each including an etched body comprising nanopillar structures and a buried metal contact layer.
Figure 2B:
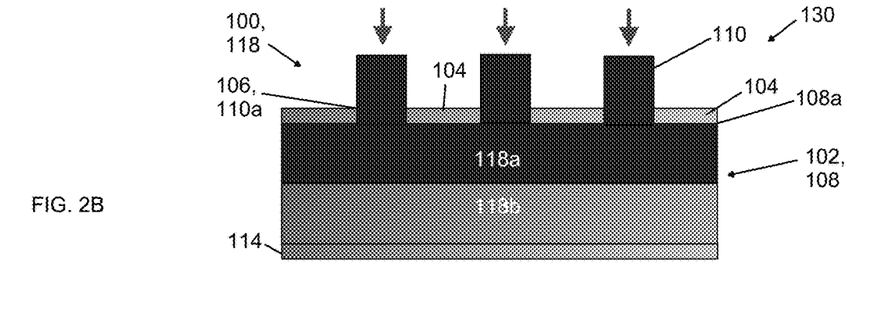
Figure 2C:
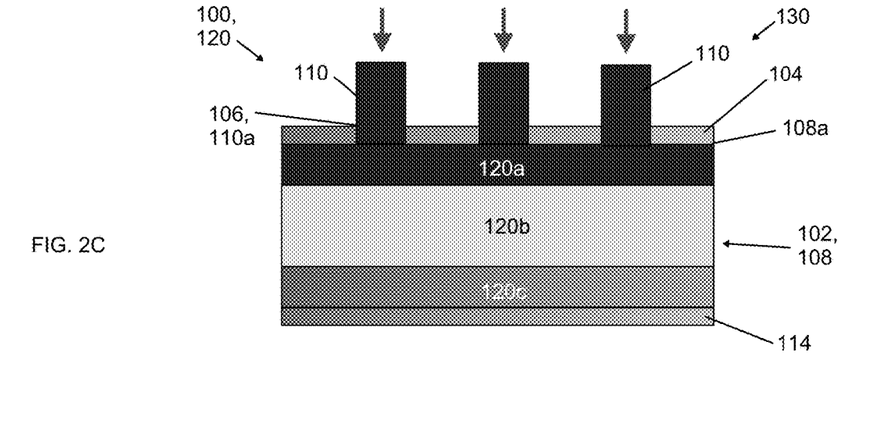
Figure 2D:
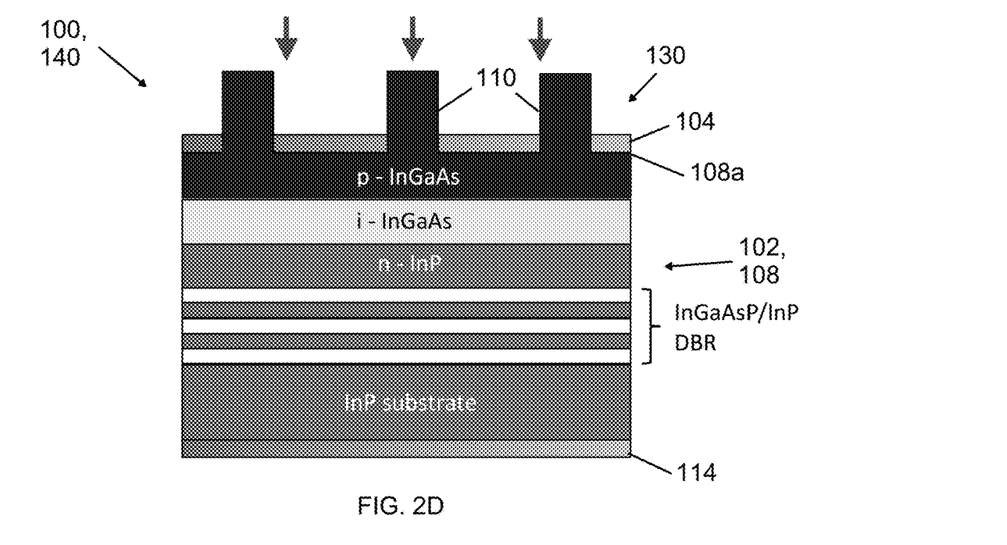
Figure 2E:
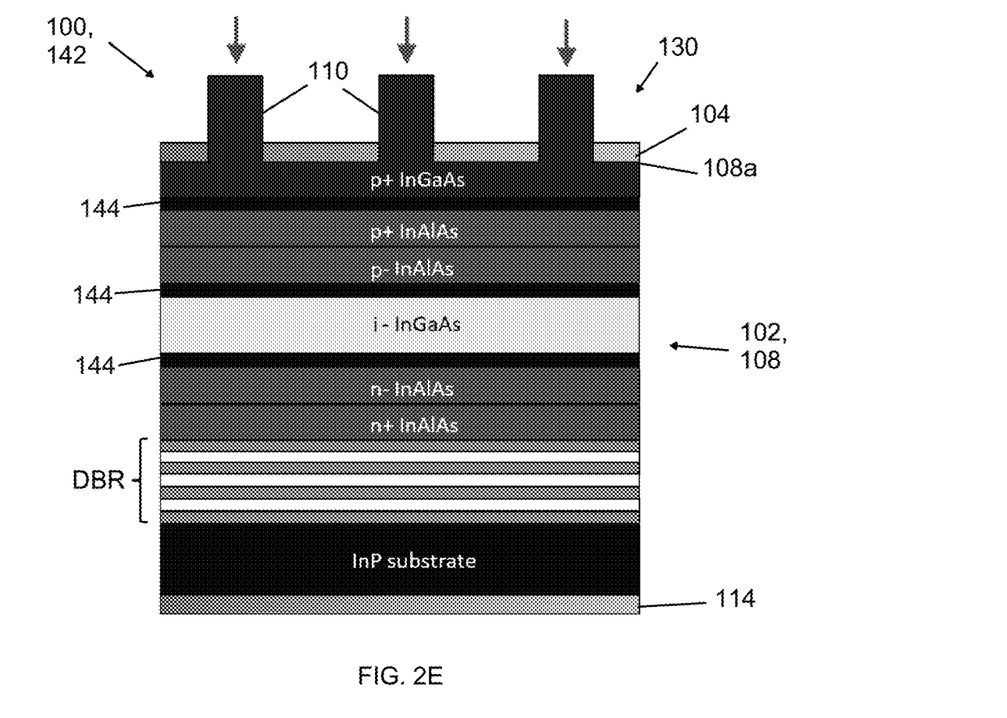

In the examples of FIGS. 2A-2C, the optoelectronic devices 100 are photodetectors, specifically a metal-semiconductor or Schottky photodetector 116 (FIG. 2A), a p-n photodetector 118 (FIG. 2B), a p-i-n photodetector 120 (FIG. 2C), a p-i-n photodetector 140 with a distributed Bragg reflector (DBR) (FIG. 2D), and a p-i-n photodetector 142 including a DBR and graded semiconductor layers (FIG. 2E). The buried metal contact layer 104 enables high light transmission as well as near uniform electrical contact, and is especially useful for the metal-semiconductor photodetector 116 of FIG. 2A, where metal is needed to form the Schottky barrier. The photodetector 116 includes a metal-semiconductor junction with an n-doped semiconductor layer 116a, such as n-GaAs. The high light transmission possible with the buried metal contact layer may help to relax the metal coverage constraint in metal-semiconductor photodetector design.

The device 100,118 of FIG. 2B includes a p-n junction with a p-doped semiconductor layer 118a on an n-doped semiconductor layer 118b, such as n-GaAs on p-GaAs. The device 100,120 of FIG. 2C includes a p-doped semiconductor layer 120a (e.g., p-Si) on an intrinsic semiconductor layer 120b (e.g., i-Si), which is on an n-doped semiconductor layer 120c (e.g., n-Si). Similarly, the device 100,140 of FIG. 2D includes a p-i-n junction (e.g., p-InGaAs on i-InGaAs on n-InP) with a DBR including alternating layers of different refractive index materials (e.g., InGaAsP/InP). The photodetector 100,142 of FIG. 2E also includes a DBR as well as graded semiconductor layers 144 (which are graded in composition and/or doping). Such devices may be suitable for telecommunications applications which utilize the 1.3-1.5 micron wavelength range. These examples are provided to show the diversity and complexity of optoelectronic devices that may be formed with a light-transmissive buried metal grating using the MacEtch process described herein.

In each of the preceding examples, the nanopillar structures 110 comprise the same semiconductor material as the top-most layer of the semiconductor structure 102. For example, the nanopillar structures 110 of the p-i-n photodetector 120 of FIG. 2C comprise the same p-doped semiconductor material (e.g., p-Si) as the p-doped semiconductor layer 120.

The nanopillar structures 110 of the optoelectronic device 100 may also or alternatively have a multilayer structure including more than one semiconductor layer, such as several graded p-doped semiconductor layers, or several graded n-doped layers. It is also possible that an active region (e.g., p-n or p-i-n junction) may be included within the nanopillar structures 110. However, such a configuration cannot exploit the optical benefits of the buried metal contact layer 104, because, in such a scenario, the buried metal contact layer may have to function as the bottom metal contact layer, which need not be transparent, and the device may require deposition of an additional transparent top contact layer (e.g., a conductive oxide) overlying the tops of the nanopillar structures to provide electrical connection to the active region. Thus, due to the unexpected optical transparency of the buried metal pattern layer 104, the optoelectronic devices set forth in the present disclosure are preferentially designed such that the semiconductor layers 108, not the nanopillar structures 110, include the active region.

Because the nanopillars 110 are formed in an extrusion-like process as the patterned metal contact layer 104 sinks into the semiconductor layer(s) 108 during etching, the base 110a of each nanopillar structure 110 may be in physical contact with an entirety of the surrounding portion 112 of the buried metal contact layer 104, as can be seen in the micrograph of FIG. 1C. It should be noted, however, that the buried metal contact layer 104 does not overlie any portion of the nanopillar structures 110.

Generally speaking, the buried metal contact layer 104 may have nanoscale and/or microscale features, where nanoscale features may be considered to be from about 1 nm to about 100 nm in lateral size, and microscale (or submicron) features may be considered to be greater than 100 nm to about 1 micron in lateral size. The arrangement of holes 106 in the patterned metal contact layer 104 may be a periodic two-dimensional (2D) array of holes. The holes 104, and thus the nanopillar structures 110 extruded through the holes 106, may have any desired transverse cross-sectional shape—circular, square, nearly square (e.g., square with rounded corners), triangular, pentagonal, hexagonal, irregular, etc. The cross-sectional area of the nanopillar structures 110 may vary with height h depending on the etching conditions.

It is possible to tune the wavelength range of light transmission by altering the period or pitch Λ of the array of holes 106, which in turn alters the spacing of the nanopillar structures 110 formed during etching. Initial findings suggest that, for a given optoelectronic device structure, a reduction in the pitch Λ of the array of holes 106 (and thus a decrease in the spacing of the nanopillar structures 110) may lead to transmission of shorter wavelengths of light. Conversely, an increase in the pitch Λ of the hole array (and thus an increase in the spacing of the nanopillar structures 110) may lead to transmission of longer wavelengths of light. By manipulating the pitch Λ of the array of holes 106, it is possible to produce optoelectronic devices 100 that can selectively transmit a desired wavelength range of incident light. The pitch Λ is generally in the range from about 50 nm to about 5 microns, which can allow access to wavelengths ranging from the UV to the infrared (e.g., from 300 nm to 10 microns). Depending on the intended wavelength transmission range, the pitch may be more specifically selected to be from about 50 nm to about 500 nm, from about 500 nm to about 1,000 nm (1 micron), from about 1 micron to 1.5 microns, from about 1.5 microns to about 2 microns, from about 2 microns to about 2.5 microns, from about 2.5 microns to about 3 microns, from about 3 microns to about 3.5 microns, from about 3.5 microns to about 4 microns, from about 4 microns to about 4.5 microns, or from about 4.5 microns to about 5 microns. Optoelectronic devices 100 including buried metal contact layers 104 with hole arrays/nanopillar structures of different periods Λ are illustrated in FIGS. 4A-4C and FIGS. 6A-6B, which are described below.

Typically, each hole 106 in the buried metal contact layer 104 has a width or diameter D in the range from about 10 nm to about 5 microns, and more typically from about 500 nm to about 2 microns. For example, the width or diameter D may be at least about 10 nm, at least about 50 nm, at least about 200 nm, or at least about 500 nm, and up to about 5 microns, or up to about 2 microns. The width or diameter D of each hole in combination with the pitch Λ can determine the surface coverage of the buried metal contact layer 104. Remarkably, even with an areal surface coverage of 40% or greater, or 50% or greater, and as high as 80% or 90%, the buried metal contact layer 104 may exhibit high optical transmission.

Figure 3:
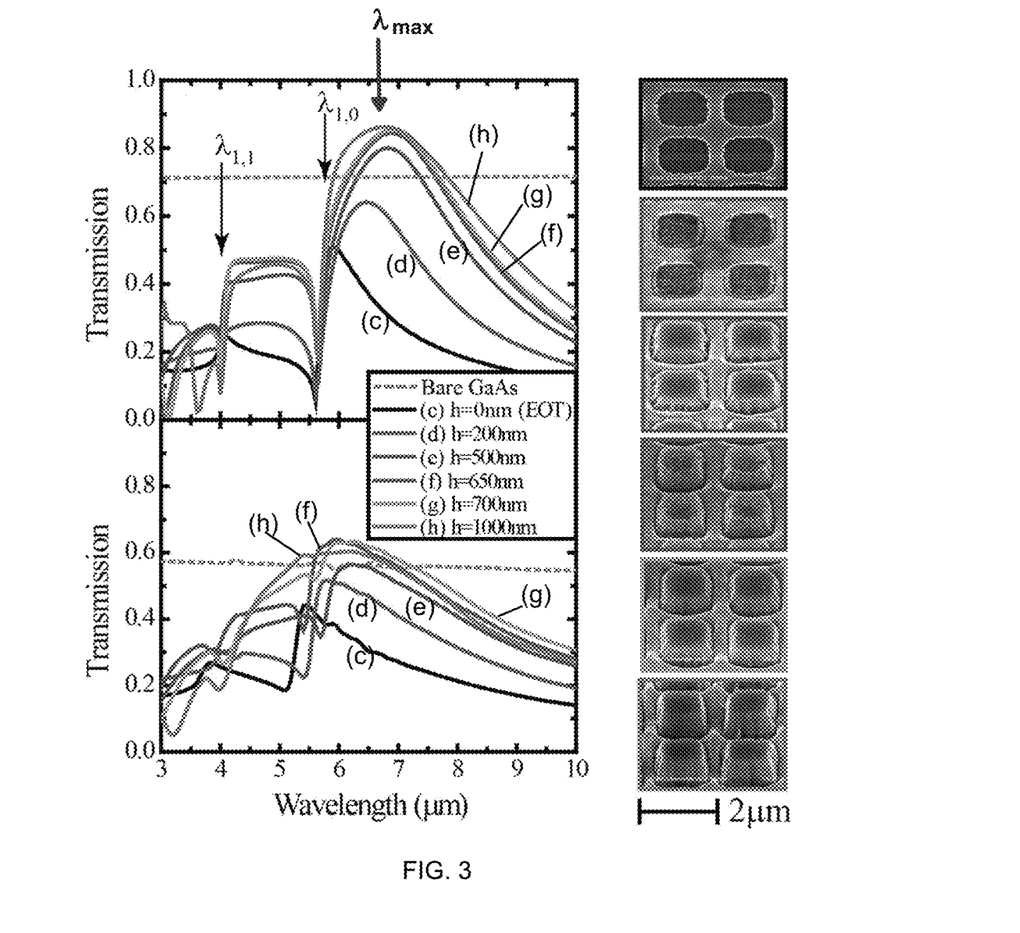
FIG. 3 shows normal incidence transmission spectra (simulated, top; experimental, bottom) obtained for etched bodies including buried gold contact layers and GaAs nanopillar structures ranging in height from h=0 to 1000 nm (0 nm, 200 nm, 500 nm, 650 nm, 700 nm and 1000 nm). The SEM images on the right show portions of the etched bodies obtained at each etched depth (or nanopillar height h).

The height h of each nanopillar structure is determined by the etch depth and may vary over a wide range, e.g., from about 10 nm to about 10 microns. Data reveal that taller nanopillar structures can significantly enhance light transmission into the optoelectronic device. Normal incidence transmission spectra obtained for etched bodies including buried gold contact layers with GaAs nanopillar structures ranging in height from h=0 to 1000 nm (0 nm, 200 nm, 500 nm, 650 nm, 700 nm and 1000 nm) are summarized in FIG. 3. Simulated spectra obtained from 3D rigorous coupled wave analysis (RCWA) are shown in the top plot and experimental spectra obtained from Fourier transform infrared (FTIR) transmission spectroscopy are shown in the bottom plot. The SEM images on the right show portions of the etched bodies corresponding to etch depths (nanopillar heights h) of 0 nm, 200 nm, 500 nm, 650 nm, 700 nm and 1000 nm, respectively, from top to bottom. The spectra show that, as the pillar height h is increased—corresponding to deeper embedding of the buried metal contact layer—the transmission spectrum changes dramatically, with a marked increase in light transmission. Thus, it may be advantageous for the nanopillar structures 110 to have a height h of at least about 50 nm, at least about 200 nm, at least about 400 nm, at least about 600 nm, or at least about 800 nm, and up to about 10 microns. The spectra of FIG. 3 show not only a substantial increase in the peak transmission (e.g., from about 40% for an unetched sample (h=0 nm) to about 65% for samples containing the tallest nanopillars) but also a significant broadening of the transmission peaks over a wider range of wavelengths. Remarkably, over the wavelength range of about 5 microns to close to 7.5 microns, light transmission through an optoelectronic device including a buried metal contact layer with GaAs nanopillar structures of at least 650 nm in height h is higher than light transmission through a bare, unstructured (smooth) GaAs surface; light transmission is about 60% in the former case compared to about 55% transmission in the latter. The same device without etching (h=0, where the patterned metal contact layer is not buried) exhibits light transmission of about 40-45% over a narrow wavelength range of about 5.3 to 5.7 microns. The simulated and experimental data demonstrate that, in optoelectronic devices including nanopillar structures and a buried metal contact layer, the latter acts as an antireflection coating over a fairly broad range of mid-infrared wavelengths—despite covering about 50% or more of the device surface.

Figure 4A:
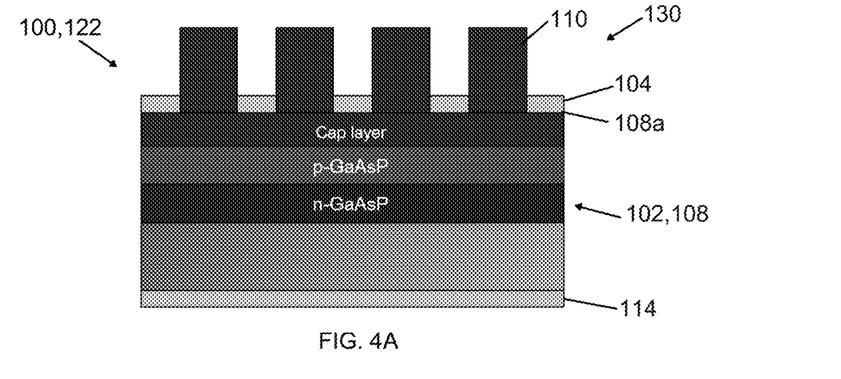
FIGS. 4A-4C show cross-sectional schematics of exemplary light emitting diodes (LEDs), each including an etched body comprising nanopillar structures and a buried metal contact layer.
Figure 4B:
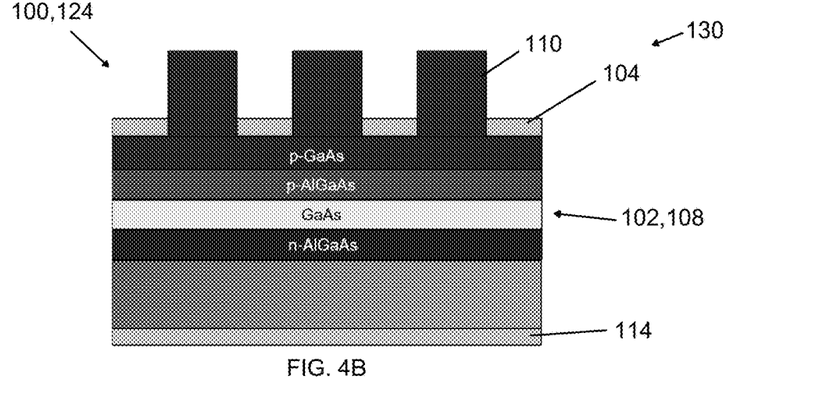
Figure 4C:
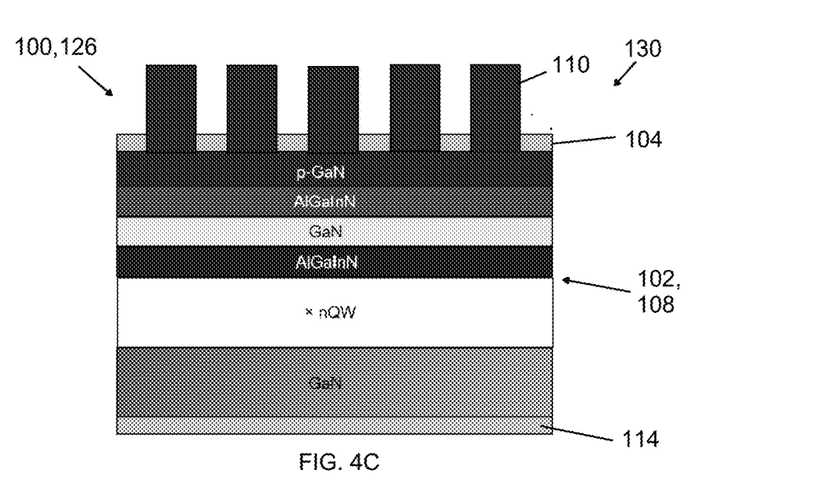

In addition to the photodetectors of FIGS. 2A-2E, other types of optoelectronic devices 100 including a buried metal contact layer 104 may be formed by the MacEtch process. FIGS. 4A-4C show cross-sectional schematics of exemplary light emitting diodes (LEDs) 122,124,126. In traditional surface-emitting LEDs, injected current from the anode flows horizontally in a thin p-doped semiconductor layer and suffers from high sheet resistivity and a nonuniform current distribution. In contrast, in the MacEtch-produced devices, the buried metal contact layer 104 serves as a transparent top contact while enabling nearly uniform electrical contact to the active region. The buried metal contact layer 104 can also serve as a wavelength filter. The active region may be designed as a simple p-n junction, as shown in FIG. 4A, as a double heterostructure, as shown in FIG. 4B, or as a multiple quantum well structure, as shown in FIG. 4C.

The LED of FIG. 4A may include, for example, a cap layer on a p-doped semiconductor layer comprising, for example, p-GaAsP, which is deposited on an n-doped semiconductor layer comprising, for example, n-GaAsP, to form the p-n junction. The bottom-most semiconductor layer may be GaN. The double heterojunction of FIG. 4B may include two p-doped semiconductor layers (e.g., p-GaAs on p-AlGaAs) on an intrinsic semiconductor layer (e.g., GaAs), which is deposited on an n-doped semiconductor layer (e.g., n-AlGaAs), with the bottom-most semiconductor layer being GaN. The multiple quantum well structure of FIG. 4C may include a stack of semiconductor layers having the following exemplary layer-by-layer composition (from top to bottom): p-GaN, AlGaInN, GaN, AlGaInN, multiple quantum wells (nQW), GaN. Each of these devices 100 is designed with a buried metal grating 104 and nanopillar structures 110 having a different pitch or period Λ in order to control the wavelength of light transmitted, as discussed above.

Figure 5:
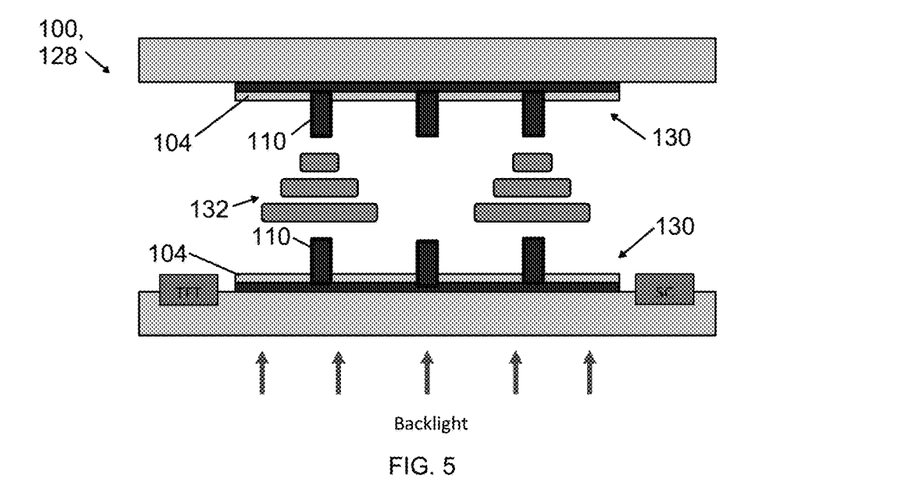
FIG. 5 shows a cross-sectional schematic of an exemplary liquid crystal display (LCD) including a liquid crystal material in between opposing etched bodies, where each etched body comprises nanopillar structures and a buried metal contact layer.

Another exemplary optoelectronic device 100, a liquid crystal display (LCD) 128, is shown in FIG. 5. The LCD includes two etched bodies 130 as described above, each disposed facing each other on a transparent (e.g., glass) substrate with a liquid-crystal material 132 in between. Each etched body 130 includes an array of nanopillar structures 110 and a buried metal contact layer 104 and may function as a transparent contact and/or a color filter for the LCD.

Figure 6A:
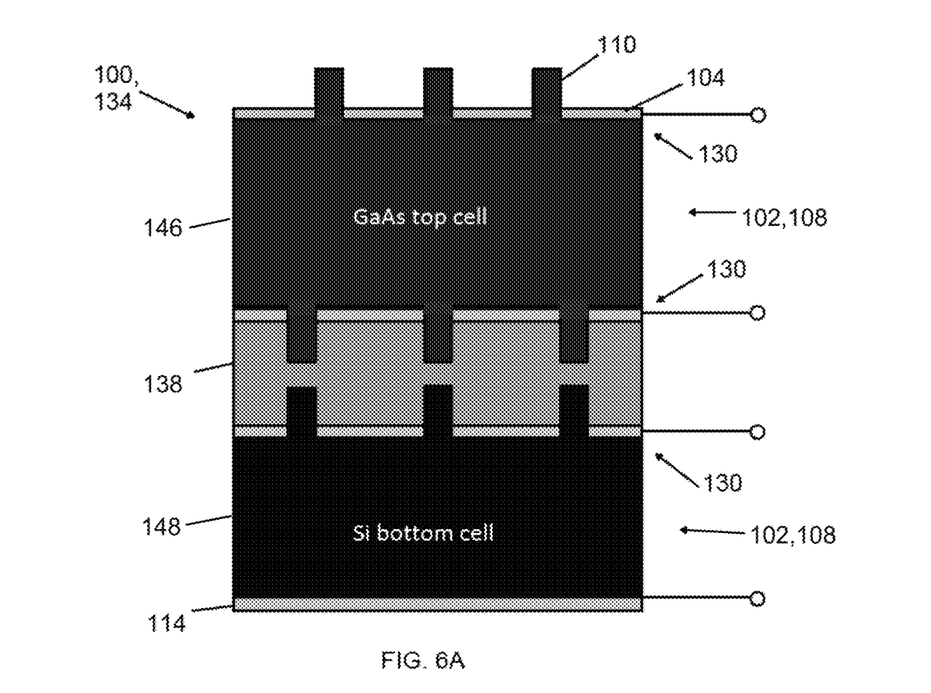
FIGS. 6A and 6B show cross-sectional schematics of exemplary multi-terminal tandem solar cells comprising a stack of etched bodies, where each etched body includes nanopillar structures and a buried metal contact layer.
Figure 6B:
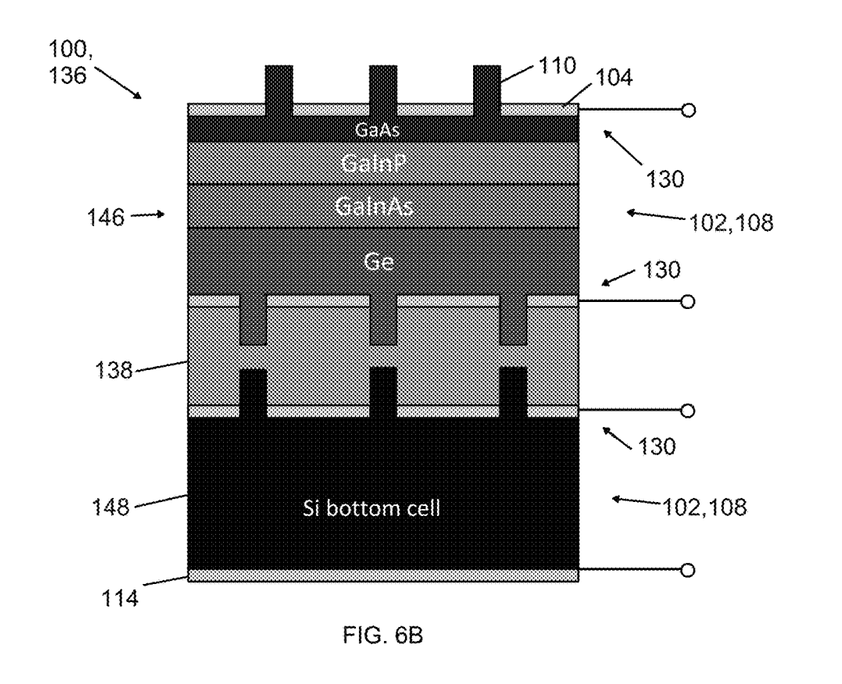

FIGS. 6A-6B show exemplary four-terminal tandem solar cells 134,136. The devices 100,134,136 are formed from a stack of etched bodies 130 prepared by the MacEtch process as described above and then assembled into subcells (e.g., top and bottom subcells 146,148), where adjacent facing etched bodies 130 are separated by an adhesion layer 138. Because the subcells are electrically separated, the four-terminal tandem (4-T) solar cell 134,136 avoids the current matching issue as well as tunnel junctions and related losses inherent to two-terminal or monolithically integrated tandem solar cells. In addition, the 4-T tandem solar cells 134,136 can utilize a combination of materials that are not constrained to a lattice-matching condition. The exemplary 4-T tandem solar cell 134 of FIG. 6A includes a GaAs top subcell and a Si bottom subcell, and the exemplary 4-T solar cell 136 of FIG. 6B includes a GaAs/GaInP/GaInAs/Ge top subcell and a Si bottom subcell. Typically, the presence of electrodes between subcells blocks light transmission from the top surface to the lower subcells of the device; however, the incorporation of etched bodies 130 comprising nanopillar structures 110 and an embedded metal contact layer 104 allows for light transmission through the device 134,136.

To form the top subcell 146 of each 4-T tandem solar cell 134,136, a patterned metal contact layer is applied to top and bottom surfaces of a semiconductor structure 102 and etching proceeds from both ends, sequentially or simultaneously, leading to the etched bodies 130 shown on opposing ends of the semiconductor structure 102,108, where each etched body 130 includes a buried metal grating 104 and nanopillar structures 110 of the desired pitch Λ. The top subcell 146 may be attached to the bottom subcell 148 using an optically transparent adhesion layer 138. As indicated above, the pitch Λ of the nanopillar arrays 110 can be optimized for each subcell 146,148 to transmit light of a preferred wavelength range. For example, referring to FIG. 6A, the period Λ of the nanopillar structures 110 protruding from the top surface of the top cell 146 is different from (in this case, smaller than) that of the nanopillar structures protruding from the top surface of the bottom cell 148.

The patterned metal contact layer 104 shown schematically in FIG. 1A may be formed by depositing and then patterning a thin film using methods known in the art. For example, physical vapor deposition (e.g., sputtering or evaporation) may be used along with a commercially available deposition system. Generally, the thickness of the deposited thin film lies in the range of from about 5 nm to about 500 nm, or from about 50 nm to about 200 nm. After deposition, conventional patterning methods (e.g., lithography and etching) may be employed to form the desired 2D pattern in the deposited thin film. As discussed above, during etching, the patterned metal contact layer sinks into the semiconductor structure to produce an etched body (e.g., a nanopillar array) that has, at any given etched depth, a 2D areal geometry complementary to that of the patterned metal contact layer. Under controlled etch conditions, only the semiconductor material directly underneath the patterned metal contact layer is removed. The sidewall roughness of MacEtch-produced semiconductor structures may be determined by the edge roughness of the patterned metal contact layer. The sidewall verticality may be affected by competing etching processes when mass transport of the oxidized species is limited.

Suitable etchants for the MacEtch process include an oxidizer and an acid at an appropriate molar ratio, as described in detail in U.S. Pat. No. 8,486,843, entitled "Method of Forming Nanoscale Three-Dimensional Patterns in a Porous Material," and U.S. Pat. No. 8,951,430, entitled "Metal-Assisted Chemical Etching to Produce III-V Semiconductor Nanostructures," both of which were incorporated by reference above. The etchant may be selected so that it selectively removes semiconductor material covered by the patterned metal contact layer, and does not etch semiconductor material uncovered by the patterned metal contact layer. Suitable oxidants may include, for example, $H_2O_2$, $KMnO_4$ and/or $K_2S_2O_8$. Suitable acids may include, for example, HF and/or $H_2SO_4$. The etching may be carried out at a temperature from about 0° C. to about 60° C., or at room temperature. The length of time in the etchant solution can depend on the desired etch depth. For example, the sample to be etched may be immersed in the etchant for a time duration from 1 minute to 30 minutes to achieve the desired etch depth (and thus the desired nanopillar height h).

Additional Optical Transmission Data

Figures 7A, 7B, 7C, 7D:
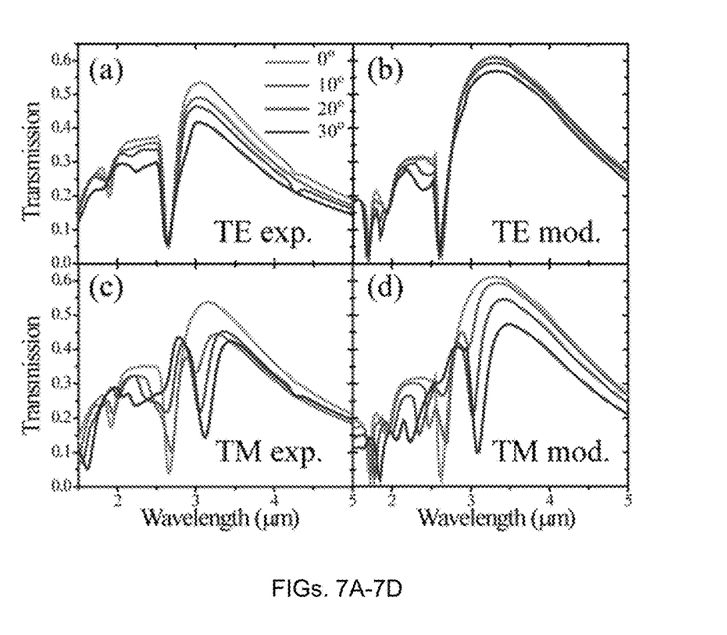
Figures 8A, 8B, 8C, 8D:
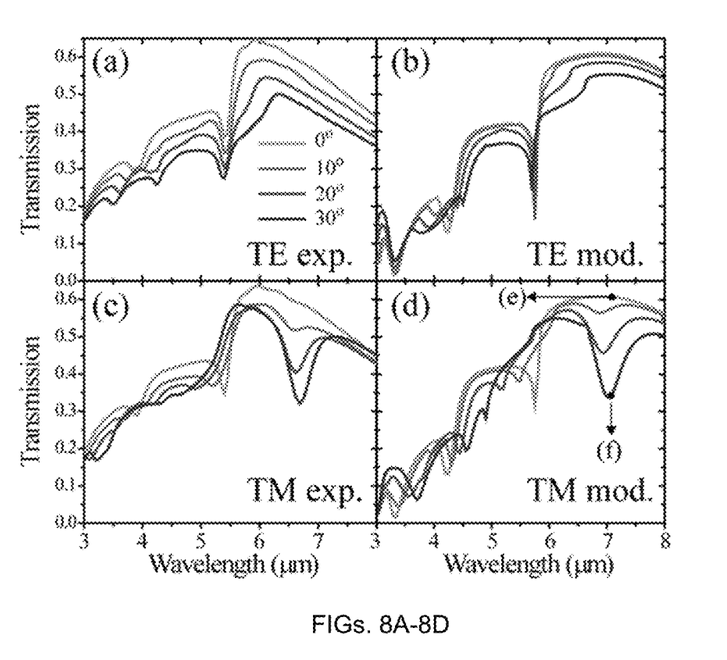

Angular dependent transmission data for two different samples ($\Lambda$=0.77 µm, D=0.55 µm, h=0.5 µm and $\Lambda$=1.75 µm, D=1.2 µm, h=0.7 µm) are shown in FIGS. 7A-7D and 8A-8D for both transverse electric (TE) and transverse magnetic (TM) polarized light, respectively. As can be seen in FIGS. 7A and 8A, the TE-polarized transmission peaks for each sample remain reasonably large and (spectrally) stationary for incidence angles up to 30°, with the dips in the spectrum [associated with (0,1) SPP coupling] remaining fixed in position and magnitude as would be expected for incident light with unchanging momentum in the direction of SPP propagation. Splitting in the (1,1) SPP-coupling feature is observed for the TE spectra, as non-normal incident TE-polarized light may have a varying momentum component in the (1,1) directions with increasing incidence angle.

The TM polarized data (FIGS. 7C and 8C) differ from the TE data in two significant regards. First, as the sample is rotated away from normal, there is a weakening in the transmission dips associated with SPP-coupling, as would be expected for incident light with momentum components in the direction of SPP propagation, which will lift the wavelength degeneracy of the positive and negative propagating (1,0) and (1,1) SPPs excited at the Au/GaAs interface. More interestingly, the appearance of a strong dip in the center of each sample's primary transmission peak is apparent, which grows in magnitude as the incidence angle increases. RCWA simulations for each sample for both TE-polarized (FIGS. 7B and 8B) and TM-polarized (FIGS. 7D and 8D) incident radiation largely agree with experimental data.

The results from the 3D RCWA simulations of the fabricated etched bodies which include buried EOT structures offer insight into both the primary finding of this work (the strongly enhanced transmission seen with increasing pillar height) and the spectral anomalies observed in our angular-dependent transmission (strong dips in TM-polarized transmission with increasing angle). These models suggest that the high reflectivity of the planar GaAs-air and metal-air interfaces is modulated through coupling of light into waveguide-type modes supported by the pillar arrays.

Figure 9:
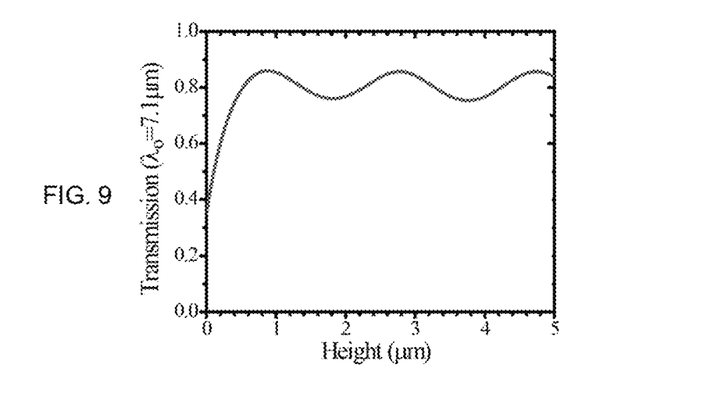
FIG. 9 shows numerically calculated peak transmission as a function of pillar height h, including substrate effects, through an etched body including a buried EOT structure having the following characteristics: Λ=1.75 μm, D=1.2 μm and h=0.7 μm.
Figures 10A, 10B, 10C, 10D, 10E, 10F, 10G, 10H, 10I, 10J:
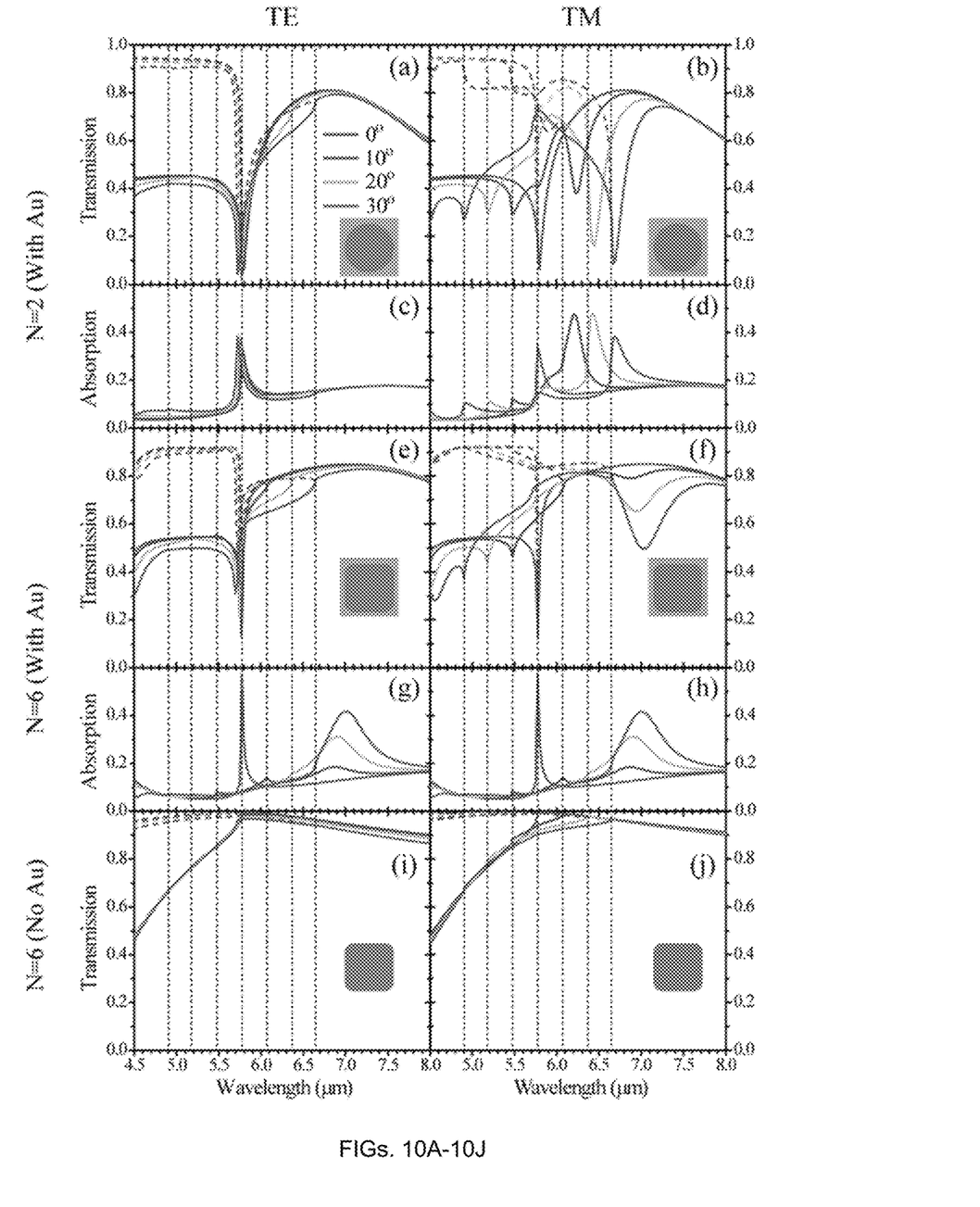
FIGS. 10A-10J show a comparison of TE and TM specular and total transmission and total absorption for etched samples including a buried EOT structure (Λ=1.75 μm, D=1.2 μm and h=0.7 μm) as a function of incident angle (from θ=0° to θ=30°) and pillar cross section. Insets in the transmission plots show the pillar cross section (circular or nearly square).

FIG. 9 shows the calculated transmission, at normal incidence, for a fixed wavelength $\lambda_0$=7.1 µm as a function of pillar height. It can be observed that transmission oscillates with typical period $\Delta h \approx 1.9$ µm. Analysis of propagating modes supported by a layer of periodic dielectric pillars suggests that the transmission of light through this layer is dominated by modes with propagation constant $k_z^m \approx 1.6$ µm−1; note $\Delta h \approx \lambda/k_z^m$. This fact further confirms that the observed transmission of light through the structured composite is likely related to in-coupling of incident radiation into these modes.

Unlike a traditional EOT grating, where peak transmission can be thought of as an interference maximum associated with light directly transmitted through the arrayed apertures and light scattered from surface modes, the transmission peak in the etched samples with a buried EOT structure results from efficient avoidance of coupling to plasmonic modes. Indeed, transmission through a pillar structure with no buried metal contact layer shows broadband antireflection properties, as can be observed in FIGS. 10A-10J. Note that the simulations in these figures ignore absorption/reflection in the substrate, so as to elucidate the optical properties of the top patterned surface that dominates the spectral response of the etched body. Such coupling cannot be avoided for all wavelength/angle/polarization combinations. As a result, the narrow-band angle-dependent transmission minima appear at higher angles along with the broader anti-reflection (enhanced transmission) background. These minima are associated with the coupling into, and absorption by, the buried metal contact layer. The spectral position of this minimum may depend on the geometrical parameters of the buried-EOT structures, as revealed in the figures.

Experimental Details

For the fabricated examples described in this disclosure, a 30 nm-thick gold (Au) film is formed on double-side polished semi-insulating (SI) GaAs (100) and then patterned. Samples are initially cleaned with a diluted HCl solution to remove the native oxide in order to ensure an intimate contact between the deposited Au film and the underlying GaAs, which can be critical to the uniformity and effectiveness of the MacEtch process. After removal of the native oxide, the Au film is deposited by e-beam evaporation, and then a layer of SU-8 (thickness of about 5 µm) is spun over the Au. Polydimethylsiloxane (PDMS) stamps, which include a 2D array of holes with periodicities $\Lambda$=0.77 µm and $\Lambda$=1.75 µm, are used to pattern the Au film by soft lithography. The periodic patterns on the PDMS stamps are transferred to the SU-8 coated samples by manually pressing the stamps against the samples, followed by a cure at 95° C., leaving an SU-8 film with a 2D periodic array of apertures. After etching of the exposed Au film using a TFAC Au etchant through the SU-8 etch mask, the SU-8 is stripped from the sample, leaving an Au film with a periodic hole array on the GaAs substrate. The MacEtch process is then performed using a solution containing $KMnO_4$ (0.025 g) and HF (15 mL) diluted by de-ionized water (15 mL) at an etch rate of about 118±10 nm/min as measured by SEM. Controlling etch time effectively allows the Au to sink into the underlying semiconductor, leaving what can be described as extruded GaAs nanopillars extending through the holes in the Au film. The resulting diameter and period of the GaAs pillars are controlled by the geometry of the patterned Au contact layer, now "buried" at the base of the GaAs pillars following the MacEtch process, with the height of the GaAs pillars determined by the duration of the MacEtch.

Figure 11:
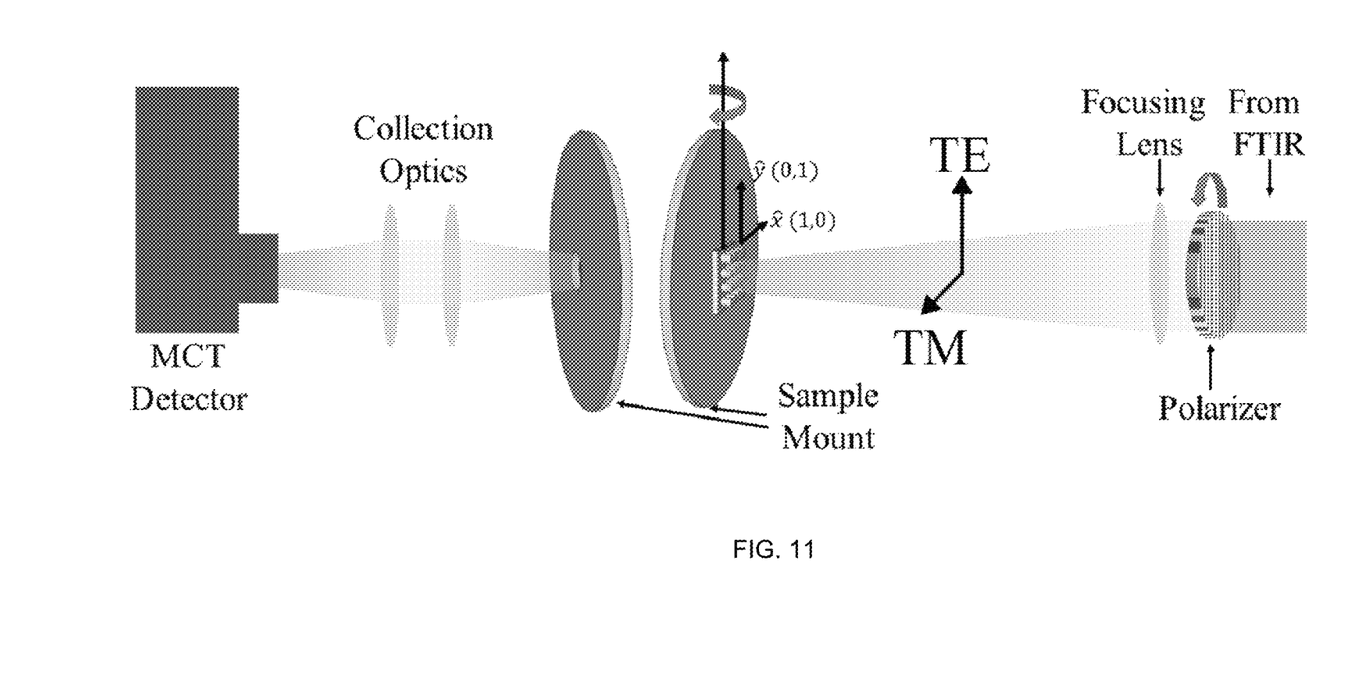
FIG. 11 shows a schematic of the experimental set-up for linearly-polarized angle-dependent transmission experiments.

Measurements:

The transmission properties of the fabricated samples are characterized using a Bruker Vertex70 FTIR spectrometer in an experimental setup shown schematically in FIG. 11. Collimated light from the FTIR's broadband internal glo-bar is focused using an 8 in. focal length, 2 in. diameter ZnSe lens onto the sample, held outside the FTIR on a brass mount with a 2 mm diameter aperture, and with the aperture array's principle axes in the horizontal (1,0) and vertical (0,1) directions, as shown in FIG. 11. Light transmitted through the sample is collimated and refocused onto a liquid nitrogen-cooled HgCdTe (MCT) detector using a pair of 2 in. diameter, 3 in. focal length ZnSe lenses. The sample itself is mounted on a rotational stage with a principle axis of the 2D array aligned to the rotational axis of the stage to enable angular-dependent transmission measurements. A holographic wire grid polarizer is inserted between the first focusing lens and the sample, allowing for horizontally or vertically polarized incident radiation, corresponding to TM or TE polarization, respectively. Transmission spectra as a function of angle are taken for angles from 0° to 30° for both TM and TE polarized light. All transmission spectra are normalized to transmission through the experimental system with no sample on the mounting plate, providing an absolute transmission spectra for the fabricated samples. Transmission spectra through an unpatterned SI GaAs wafer are also collected and shown for comparison.

Modeling and Simulation:

The fabricated structures can be simulated using commercial finite element method (FEM) or finite-difference time-domain (FDTD) software such as COMSOL or Lumerical. In the present work, the simulations were performed using Rigorous Coupled Wave Analysis (RCWA) with software developed by the Podolskiy group at UMass Lowell, as described in: M. G. Moharam, T. K. Gaylord, *J. Opt. Soc. Am.* 1981, 71, 811; M. G. Moharam, E. B. Grann, D. A. Pommet, T. K. Gaylord, *J. Opt. Soc. Am. A* 1995, 12, 1068; and C. Roberts and V. Podolskiy, Repository for RCWA code, http://viktor-podolskiy-research.wiki.uml.edu/RCWA.

RCWA was used to calculate the effects of the back interface of the structure, by effectively averaging transmission over multiple thicknesses of the substrate, which is equivalent to assuming loss of coherence across the substrate layer. This allows for decoupling the transmission of the top patterned surface and that of the backside of the wafer in the simulations, something that can be difficult to do experimentally.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages of the invention, and it is not necessarily expected that all of the described advantages will be achieved with every embodiment of the invention.

The invention claimed is:

1. An optoelectronic device including a buried extraordinary optical transmission (EOT) structure, the optoelectronic device comprising:
   an etched body comprising:
      a buried metal contact layer disposed on a top surface of a semiconductor structure comprising one or more semiconductor layers, the buried metal contact layer comprising an arrangement of holes therein; and
      a plurality of nanopillar structures protruding from the top surface of the semiconductor structure and passing through the arrangement of holes, each nanopillar structure being surrounded at a base thereof by a surrounding portion of the buried metal contact layer,
   wherein, when the etched body is exposed to incident radiation having a wavelength in the range from about 300 nm to about 10 microns, at least about 50% of the incident radiation is transmitted through the etched body at a peak transmission wavelength $\lambda_{max}$.

2. The optoelectronic device of claim 1, wherein at least about 70% of the incident radiation is transmitted at the peak transmission wavelength $\lambda_{max}$.

3. The optoelectronic device of claim 1, wherein the peak transmission wavelength lies in a predetermined wavelength range selected from the group consisting of: near-ultraviolet wavelengths from about 300 nm to about 400 nm, visible wavelengths from about 400 nm to about 700 nm, near-infrared wavelengths from about 700 nm to about 2 microns, and mid-infrared wavelengths from about 2 microns to about 10 microns.

4. The optoelectronic device of claim 1, wherein the buried metal contact layer is a top metal contact layer, and further comprising a bottom metal contact layer disposed on a bottom surface of the semiconductor structure for electrical connection to the optoelectronic device.

5. The optoelectronic device of claim 1, wherein the buried metal contact layer comprises a metal selected from the group consisting of: Ag, Al, Au, Co, Cr, Cu, Fe, Hf, Ir, Mn, Mo, Pd, Pt, Rb, Re, Rh, Ta, Ti, V, W, Zn, and Zr.

6. The optoelectronic device of claim 1, wherein the buried metal contact layer does not comprise a conductive oxide.

7. The optoelectronic device of claim 1, wherein the one or more semiconductors are selected from the group consisting of Si, Ge, GaAs, InAs, InSb, GaN, GaP, GaSb, GaAsP, GaAsN, GaInAs, GaInP, AlGaAs, AlGaIn, AlGaP, AlGaInP, InGaAs, InGaN, InGaSb, InGaP, InAsSb, AlN, AlGaN, ZnSe, diamond (C), SiC and $Ga_2O_3$.

8. The optoelectronic device of claim 1, wherein the base of each nanopillar structure is in physical contact with an entirety of the surrounding portion of the buried metal contact layer.

9. The optoelectronic device of claim 1, wherein the arrangement of holes in the buried metal contact layer is a periodic arrangement of holes.

10. The optoelectronic device of claim 1, wherein each hole comprises a width or diameter D from about 10 nm to about 5 microns.

11. The optoelectronic device of claim 1, wherein a height h of the nanopillar structures is at least about 50 nm.

12. The optoelectronic device of claim 1, wherein a pitch $\Lambda$ defining a hole spacing in the buried metal contact layer is in the range from 50 nm to 5 microns.

13. The optoelectronic device of claim 1, wherein the buried metal contact layer comprises a thickness in the range from about 5 nm to about 200 nm.

14. The optoelectronic device of claim 1, wherein the buried metal contact layer covers from about 30% to about 90% of the top surface of the semiconductor structure.

15. The optoelectronic device of claim 1, wherein the one or more semiconductor layers comprise one or more of the following: an n-doped semiconductor layer, a p-doped semiconductor layer, and an intrinsic semiconductor layer.

16. The optoelectronic device of claim 1, wherein the one or more semiconductor layers comprise an active region.

17. The optoelectronic device of claim 16, wherein the active region comprises a p-n junction, a p-i-n junction, a double heterostructure, a multiple quantum well structure or a quantum dot structure.

18. The optoelectronic device of claim 1 being selected from a photodetector and a light emitting diode (LED).

19. The optoelectronic device of claim 1 comprising two of the etched bodies disposed facing each other with a liquid-crystal material therebetween, each of the etched bodies being disposed on a transparent substrate, the optoelectronic device being a liquid crystal display (LCD).

20. The optoelectronic device of claim 1 comprising a stack of the etched bodies, adjacent facing etched bodies being separated by an adhesion layer, the optoelectronic device being a multi-terminal tandem solar cell.

* * * * *